(12) United States Patent
Kim et al.

(10) Patent No.: US 9,516,743 B2
(45) Date of Patent: Dec. 6, 2016

(54) ELECTRONIC DEVICE WITH REDUCED-STRESS FLEXIBLE DISPLAY

(71) Applicant: Apple Inc., Cupertino, CA (US)

(72) Inventors: Kyung Wook Kim, Cupertino, CA (US); Young Bae Park, San Jose, CA (US); Shih Chang Chang, Cupertino, CA (US); Byung Duk Yang, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 105 days.

(21) Appl. No.: 13/778,932

(22) Filed: Feb. 27, 2013

(65) Prior Publication Data

US 2014/0240985 A1    Aug. 28, 2014

(51) Int. Cl.

| | | |
|---|---|---|
| *G09G 5/00* | (2006.01) | |
| *H05K 1/02* | (2006.01) | |
| *G06F 1/16* | (2006.01) | |
| *H01L 51/00* | (2006.01) | |
| *H01L 27/32* | (2006.01) | |

(52) U.S. Cl.
CPC ............. *H05K 1/028* (2013.01); *G06F 1/1652* (2013.01); *H01L 51/0097* (2013.01); *H01L 27/3244* (2013.01); *H01L 2251/5338* (2013.01); *H05K 1/0278* (2013.01); *Y02E 10/549* (2013.01)

(58) Field of Classification Search
CPC .. G06K 1/1652; H05K 1/0278; H05K 1/028; G06F 1/1652; G09G 2380/02; H01L 27/3244; H01L 51/0097; H01L 2251/5338; Y02E 10/549
USPC ...................................... 313/511; 345/76–83
See application file for complete search history.

(56) References Cited

U.S. PATENT DOCUMENTS

| | | |
|---|---|---|
| 4,507,170 A | 3/1985 | Myhre |
| 5,694,190 A | 12/1997 | Matsumoto et al. |

(Continued)

FOREIGN PATENT DOCUMENTS

| | | |
|---|---|---|
| CN | 102568377 | 7/2012 |
| EP | 1533852 | 5/2005 |

(Continued)

OTHER PUBLICATIONS

Park et al., U.S. Appl. No. 61/810,199, filed Apr. 9, 2013.

*Primary Examiner* — Amr Awad
*Assistant Examiner* — Aaron Midkiff
(74) *Attorney, Agent, or Firm* — Treyz Law Group, P.C.; G. Victor Treyz; Kendall W. Abbasi (57) ABSTRACT

An electronic device may have a flexible display. The display may have portions that are bent along a bend axis. The display may have display circuitry such as an array of display pixels in an active area and signal lines, thin-film transistor support circuitry and other display circuitry in an inactive area of the display surrounding the active area. The display circuitry may be formed on a substrate such as a flexible polymer substrate. The flexible polymer substrate may be formed by depositing polymer on a support structure that has raised portions. The raised portions may create locally thinned regions in the flexible polymer substrate. The reduced thickness of the flexible polymer substrate in the thinned regions may help ensure that a neutral stress plane that is associated with bending the display along the bend axis is aligned with the display circuitry, thereby minimizing stress in the display circuitry.

15 Claims, 12 Drawing Sheets

(56) References Cited

U.S. PATENT DOCUMENTS

| | | | |
|---|---|---|---|
| 5,717,556 A | 2/1998 | Yanagida | |
| 5,777,855 A | 7/1998 | Yokajty | |
| 6,104,464 A | 8/2000 | Adachi et al. | |
| 6,201,346 B1 | 3/2001 | Kusaka | |
| 6,483,714 B1 | 11/2002 | Kabumoto et al. | |
| 6,498,592 B1 | 12/2002 | Matthies | |
| 6,633,134 B1 | 10/2003 | Kondo | |
| 6,717,057 B1 | 4/2004 | Segall et al. | |
| 7,816,856 B2 | 10/2010 | Cok et al. | |
| 8,106,309 B2 | 1/2012 | Hwang | |
| 8,319,725 B2 | 11/2012 | Okamoto et al. | |
| 8,434,909 B2 | 5/2013 | Nichol et al. | |
| 8,492,969 B2 | 7/2013 | Lee et al. | |
| 8,592,832 B2 | 11/2013 | Yang et al. | |
| 9,209,207 B2 | 12/2015 | Park et al. | |
| 2002/0097352 A1 | 7/2002 | Houdeau | |
| 2002/0149572 A1 | 10/2002 | Schulz et al. | |
| 2005/0078099 A1* | 4/2005 | Amundson et al. | 345/204 |
| 2005/0212419 A1 | 9/2005 | Vazan et al. | |
| 2006/0231844 A1 | 10/2006 | Carter | |
| 2008/0024060 A1 | 1/2008 | Jonnalagadda et al. | |
| 2008/0241549 A1 | 10/2008 | Seon et al. | |
| 2008/0248191 A1 | 10/2008 | Daniels | |
| 2009/0021666 A1 | 1/2009 | Chen | |
| 2009/0148678 A1 | 6/2009 | Hwang | |
| 2009/0189835 A1* | 7/2009 | Kim et al. | 345/80 |
| 2010/0148654 A1* | 6/2010 | Yan et al. | 313/243 |
| 2010/0308335 A1 | 12/2010 | Kim | |
| 2010/0308355 A1 | 12/2010 | Hsieh | |
| 2011/0007042 A1 | 1/2011 | Miyaguchi | |
| 2011/0019363 A1* | 1/2011 | Vahlsing | H05K 7/20972 361/695 |
| 2011/0050657 A1* | 3/2011 | Yamada | H01L 27/3293 345/204 |
| 2011/0241563 A1 | 10/2011 | Kim et al. | |
| 2012/0146886 A1 | 6/2012 | Minami et al. | |
| 2012/0208306 A1 | 8/2012 | Haas et al. | |
| 2012/0307423 A1 | 12/2012 | Bohn et al. | |
| 2013/0026505 A1 | 1/2013 | Lee et al. | |
| 2013/0081756 A1 | 4/2013 | Franklin et al. | |
| 2013/0112984 A1* | 5/2013 | Kim et al. | 257/72 |
| 2013/0180882 A1* | 7/2013 | Hamers et al. | 206/736 |
| 2014/0042406 A1 | 2/2014 | Degner et al. | |
| 2014/0055702 A1 | 2/2014 | Park et al. | |
| 2014/0092338 A1 | 4/2014 | Miyazaki | |
| 2014/0183473 A1 | 7/2014 | Lee et al. | |
| 2014/0184057 A1 | 7/2014 | Kim et al. | |
| 2014/0240985 A1 | 8/2014 | Kim et al. | |
| 2014/0299884 A1 | 10/2014 | Park et al. | |
| 2015/0004375 A1 | 1/2015 | Hou et al. | |
| 2015/0069341 A1 | 3/2015 | Kim et al. | |

FOREIGN PATENT DOCUMENTS

| | | |
|---|---|---|
| EP | 2259321 | 12/2010 |
| JP | 2008033095 | 2/2008 |
| JP | 2009094099 | 4/2009 |
| JP | 2012128006 | 7/2012 |
| TW | 548185 | 8/2003 |
| TW | 201002125 | 1/2010 |
| TW | 201044899 | 12/2010 |
| TW | M429927 | 5/2012 |
| TW | 201229179 | 7/2012 |
| WO | 0027172 A1 | 5/2000 |
| WO | 2008001051 | 1/2008 |
| WO | 2012078040 | 6/2012 |

\* cited by examiner

ELECTRONIC DEVICE WITH REDUCED-STRESS FLEXIBLE DISPLAY

BACKGROUND

This relates generally to electronic devices, and more particularly, to electronic devices with displays.

Electronic devices often include displays. For example, cellular telephones and portable computers often include displays for presenting information to a user.

It can be challenging to form displays for electronic devices. Displays have active areas formed from arrays of display pixels. Inactive border regions surround the active regions. The inactive border region in a display contains support circuitry such as signal lines and thin-film transistor circuitry but does not contain active pixels for producing images for a user. To reduce the apparent size of the inactive border region, it may be desirable to use a flexible substrate in forming the display. This allows portions of the inactive border region to be bent out of sight, thereby reducing the size of the visible inactive display border and enhancing the appearance of the display. Active display regions may also be bent. For example, an active display region may be bent so that a display conforms to the curved shape of a device housing.

Challenges arise when bending displays. If care is not taken, metal signal lines can crack and display pixel circuitry can become damaged. Damage to display components such as these may cause the display to fail prematurely.

It would therefore be desirable to be able to provide improved displays for electronic devices.

SUMMARY

An electronic device may be provided with a flexible display. The display may have portions that are bent along a bend axis. For example, the edges of the display may be bent to help hide inactive display components from view by a user of the electronic device.

The display may have display circuitry such as an array of display pixels in an active area of the display. The active area may, for example, have a rectangular shape. The display may also have signal lines, thin-film transistor support circuitry, and other display circuitry in an inactive area of the display. The inactive area may, for example, have the shape of a rectangular ring that surrounds the active area.

The display circuitry may be formed on a substrate such as a flexible polymer substrate. The flexible polymer substrate may be formed by depositing a polymer layer on a temporary support structure that has raised portions. The raised portions may create corresponding locally thinned regions in the flexible polymer substrate. The reduced thickness of the thinned portions of the flexible polymer substrate may help ensure that a neutral stress plane that is associated with bending the display along the bend axis is aligned with the display circuitry, thereby minimizing stress in the display circuitry.

Further features of the invention, its nature and various advantages will be more apparent from the accompanying drawings and the following detailed description of the preferred embodiments.

DETAILED DESCRIPTION

Electronic devices may include displays. The displays may be used to display images to a user. Illustrative electronic devices that may be provided with displays are shown in FIGS. 1, 2, 3, and 4.

Figure 1:
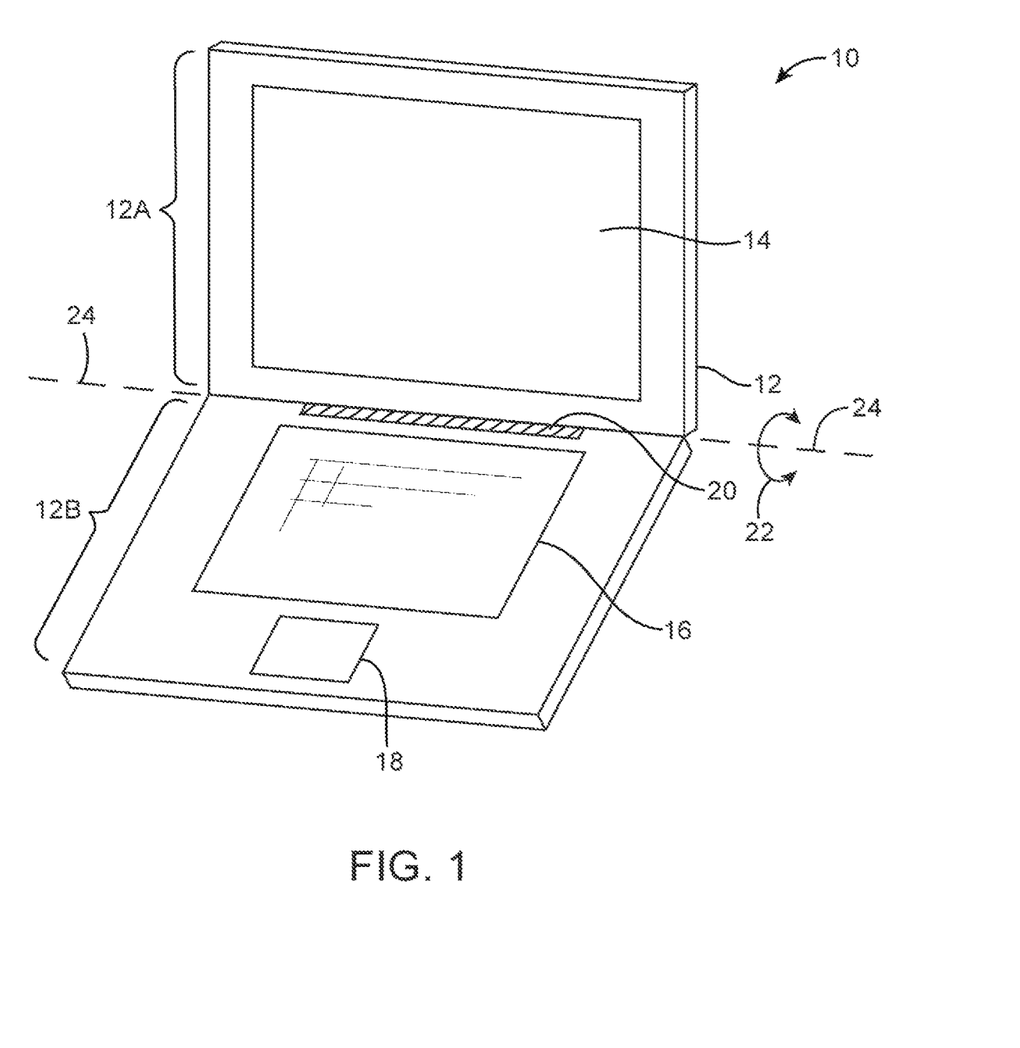
FIG. 1 is a perspective view of an illustrative electronic device such as a laptop computer with a display in accordance with an embodiment of the present invention.

FIG. 1 shows how electronic device 10 may have the shape of a laptop computer having upper housing 12A and lower housing 12B with components such as keyboard 16 and touchpad 18. Device 10 may have hinge structures 20 that allow upper housing 12A to rotate in directions 22 about rotational axis 24 relative to lower housing 12B. Display 14 may be mounted in upper housing 12A. Upper housing 12A, which may sometimes referred to as a display housing or lid, may be placed in a closed position by rotating upper housing 12A towards lower housing 12B about rotational axis 24.

Figure 2:
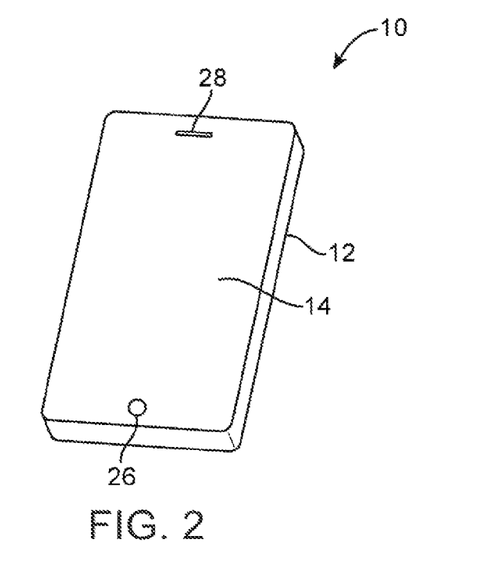
FIG. 2 is a perspective view of an illustrative electronic device such as a handheld electronic device with a display in accordance with an embodiment of the present invention.

FIG. 2 shows how electronic device 10 may be a handheld device such as a cellular telephone, music player, gaming device, navigation unit, or other compact device. In this type of configuration for device 10, housing 12 may have opposing front and rear surfaces. Display 14 may be mounted on a front face of housing 12. Display 14 may, if desired, have openings for components such as button 26. Openings may also be formed in display 14 to accommodate a speaker port (see, e.g., speaker port 28 of FIG. 2).

Figure 3:
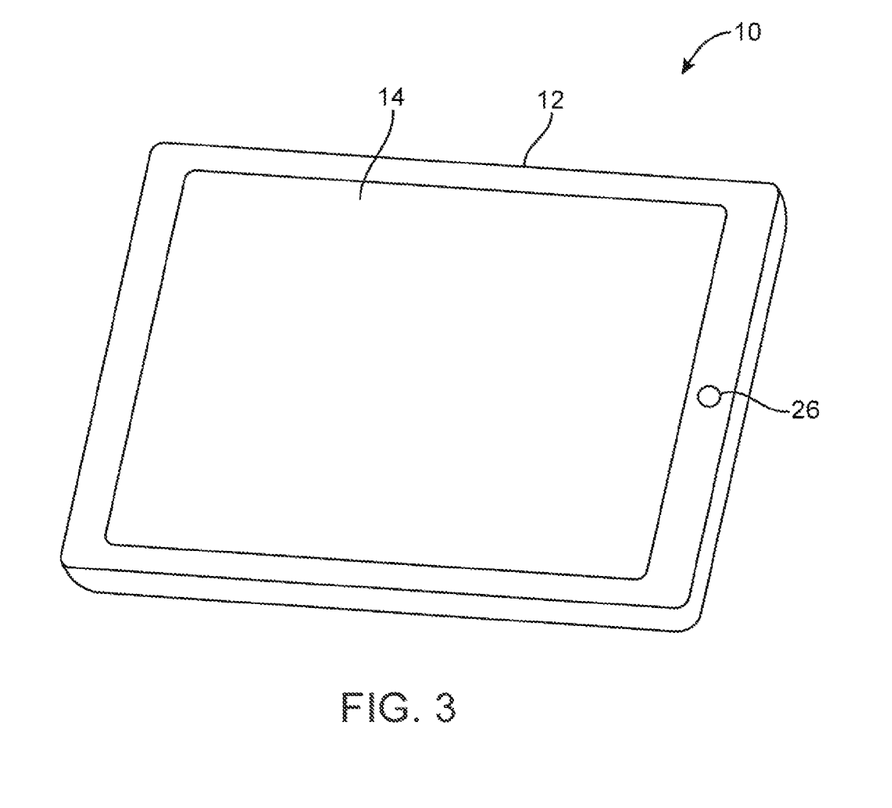
FIG. 3 is a perspective view of an illustrative electronic device such as a tablet computer with a display in accordance with an embodiment of the present invention.

FIG. 3 shows how electronic device 10 may be a tablet computer. In electronic device 10 of FIG. 3, housing 12 may have opposing planar front and rear surfaces. Display 14 may be mounted on the front surface of housing 12. As shown in FIG. 3, display 14 may have an opening to accommodate button 26 (as an example).

Figure 4:
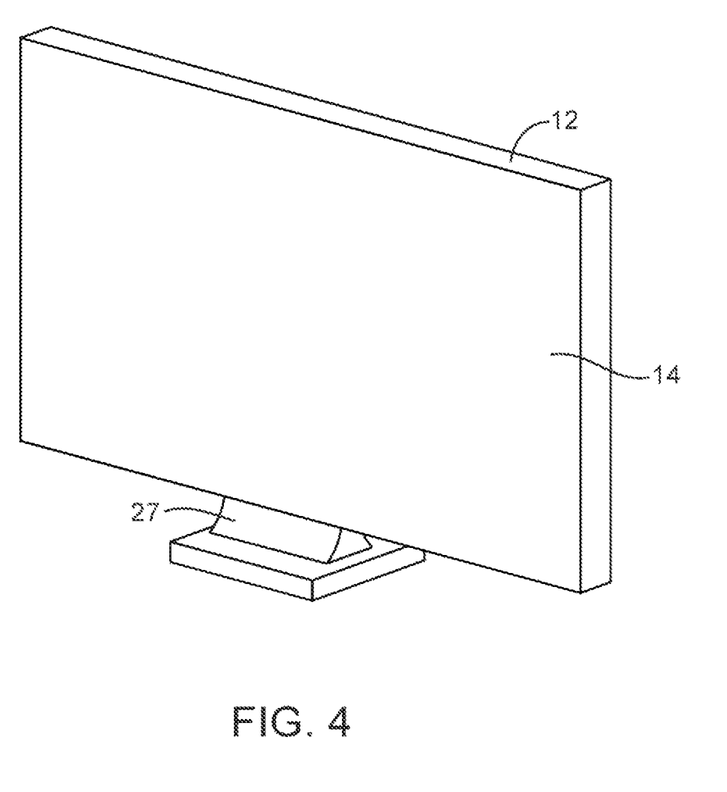
FIG. 4 is a perspective view of an illustrative electronic device such as a computer display with display structures in accordance with an embodiment of the present invention.

FIG. 4 shows how electronic device 10 may be a computer or television display or a computer that has been integrated into a display. With this type of arrangement, housing 12 for device 10 may be mounted on a support structure such as stand 27. Display 14 may be mounted on a front face of housing 12.

The illustrative configurations for device 10 that are shown in FIGS. 1, 2, 3, and 4 are merely illustrative. In general, electronic device 10 may be a laptop computer, a computer monitor containing an embedded computer, a tablet computer, a cellular telephone, a media player, or other handheld or portable electronic device, a smaller device such as a wrist-watch device, a pendant device, a headphone or earpiece device, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

Housing 12 of device 10, which is sometimes referred to as a case, may be formed of materials such as plastic, glass, ceramics, carbon-fiber composites and other fiber-based composites, metal (e.g., machined aluminum, stainless steel, or other metals), other materials, or a combination of these materials. Device 10 may be formed using a unibody construction in which most or all of housing 12 is formed from a single structural element (e.g., a piece of machined metal or a piece of molded plastic) or may be formed from multiple housing structures (e.g., outer housing structures that have been mounted to internal frame elements or other internal housing structures).

Display 14 may be a touch sensitive display that includes a touch sensor or may be insensitive to touch.

Touch sensors for display 14 may be formed from an array of capacitive touch sensor electrodes, a resistive touch array, touch sensor structures based on acoustic touch, optical touch, or force-based touch technologies, or other suitable touch sensor components.

Display 14 for device 10 includes display pixels formed from organic light-emitting diode components or other suitable display pixel structures. An optional display cover layer such as a planar or curved transparent glass or plastic sheet or other transparent member may be cover the outer surface of display 14 (if desired). Edge portions of display 14 may be bent to hide inactive border regions of display 14 from view. Display 14 may also be bent to provide display 14 with a curved surface shape (e.g., a gently curving shape that extends across the entire width of display 14). Other types of bends may be formed in display 14 if desired.

To ensure that bending operations do not damage display 14, display 14 may be provided with locally thinned regions. The locally thinned regions may help move the neutral stress plane of the display into alignment with sensitive display circuitry, thereby eliminating or at least minimizing the amount of stress imposed on the display circuitry.

Figure 5:
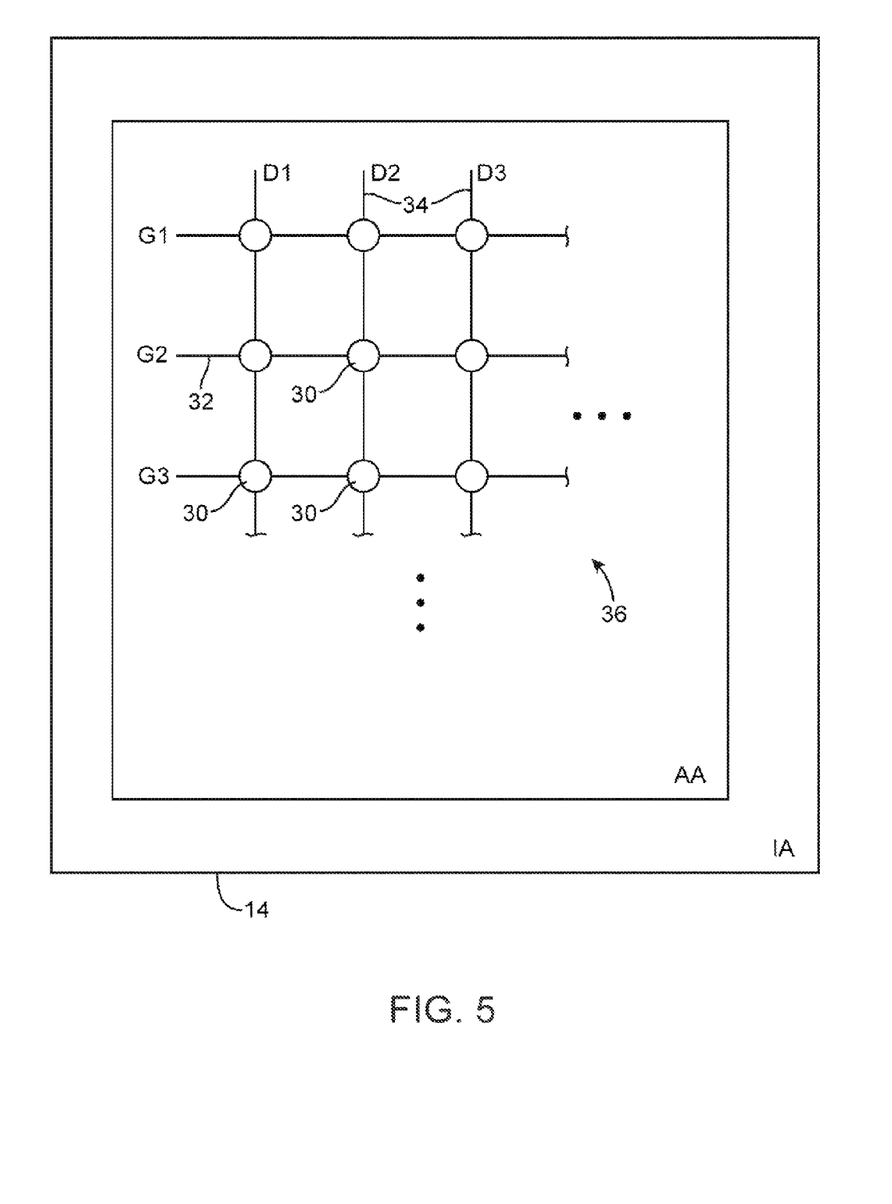
FIG. 5 is diagram of an array of display pixels in a display in accordance with an embodiment of the present invention.

FIG. 5 is a top view display 14. As shown in FIG. 5, display 14 may include display pixel array 36. Display pixel array 36 includes rows and columns of display pixels 30. Display pixels 30 may be, for example, organic light-emitting-diode pixels. Gate lines 32 and data lines 34 may be used to supply control signals to the array of display pixels 30. Display pixel array 36 may have a rectangular shape in the center of display 14. Display pixel array 36 may form an active region (active area AA) of display 14 that displays images to a user of device 10. The active area AA of display 14 may be surrounded by an inactive border region such as rectangular ring-shaped inactive area IA of FIG. 5. Inactive area IA may contain support circuitry such as thin-film transistors in gate driver circuitry and other thin-film transistor circuits, signal lines formed from metal traces, and other display circuitry that does not emit light for creating images for the user. The support circuitry in inactive area IA and the circuitry of display pixel array 36 in active area AA may potentially be subjected to stresses when display 14 is bent. By using localized thinning of the substrate layer in display 14, the stresses that are imposed on the display circuitry can be minimized.

Figure 6:
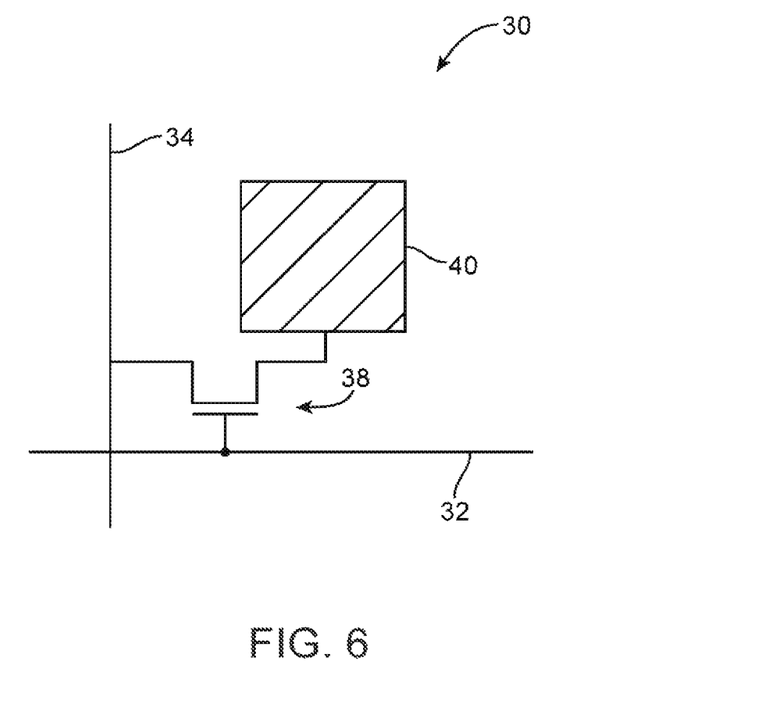
FIG. 6 is a circuit diagram of an illustrative display pixel in a display in accordance with an embodiment of the present invention.

FIG. 6 is a circuit diagram of an illustrative organic light-emitting diode display pixel 30. As shown in FIG. 6, display pixel 30 may have thin-film transistor circuitry such as thin-film transistor 38. Thin-film transistor 38 may be coupled between one of data lines 34 and a patch of light-emitting organic material 40. The gate terminal of thin-film transistor 38 may be coupled to one of gate lines 32. Other types of display pixels 30 may be used in display pixel array 36 of display 14 if desired. The example of FIG. 6 is merely illustrative.

Figure 7:
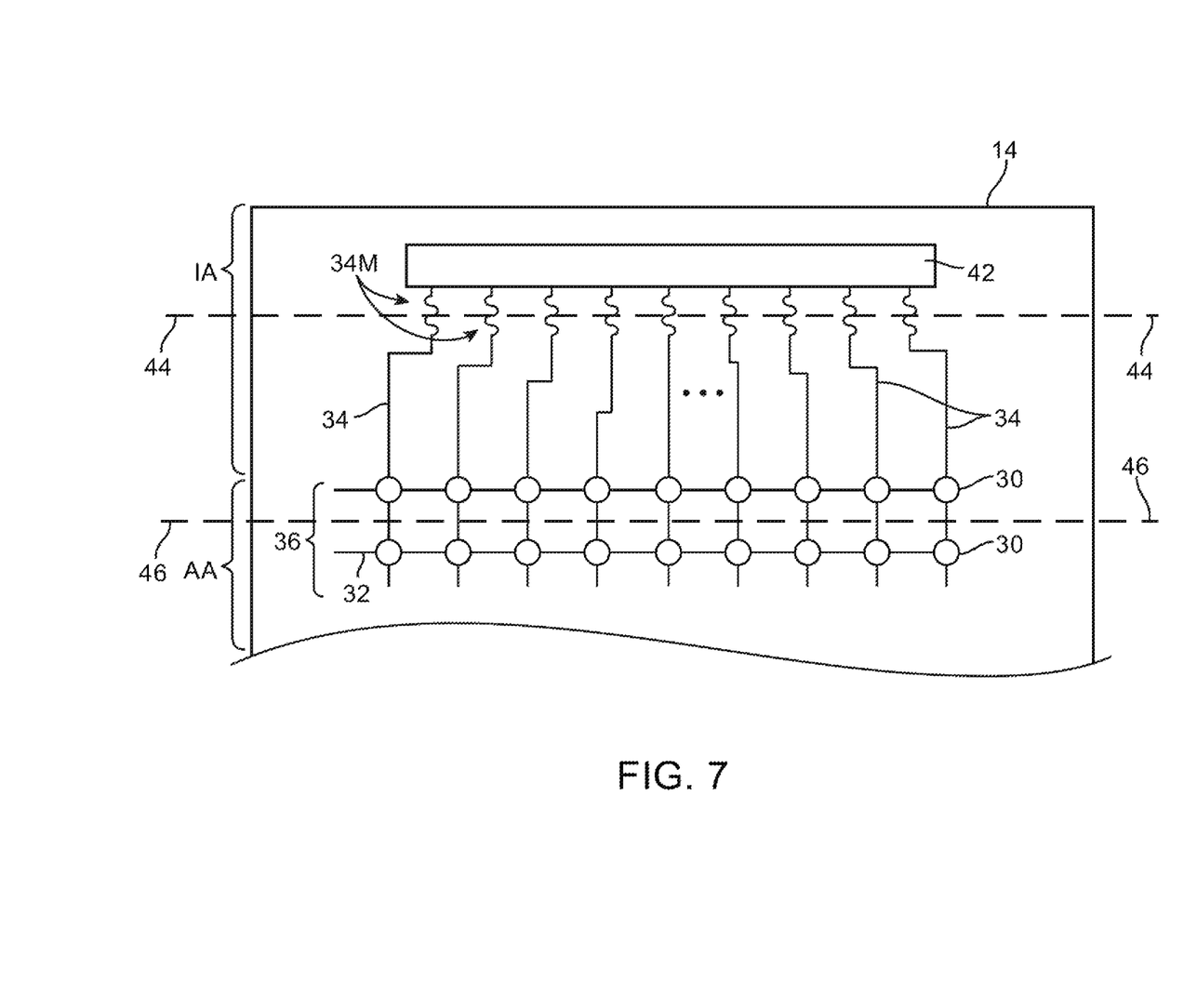
FIG. 7 is a top view of a portion of an illustrative display showing how the display may be bent along a bend axis that runs through signal lines in an inactive area of the display or that runs through an array of display pixels in an active area of the display in accordance with an embodiment of the present invention.

FIG. 7 is a top view of a portion of an illustrative display. As shown in FIG. 7, display 14 may have display support circuitry such as support circuitry 42. Support circuitry 42 may include one or more integrated circuits (e.g., display driver integrated circuits), thin-film transistor circuitry, and/or other circuitry for controlling the operation of display 14. Support circuitry 42 may be located in a portion of inactive area IA. Display pixel array 36 may be located in active area AA of display 14.

It may be desirable to bend display 14 along one or more bend axes. To fit display 14 within the tight confines of a device housing or to fold inactive portions of display 14 out of view, for example, it may be desirable to fold display 14 along a bend axis such as bend axis 44 in inactive area IA. To help prevent signal lines such as data lines 34 from becoming damaged, the signal lines may be provided with meandering portions 34M or other structures that help lines 34 resist bend-induced damage. In some electronic device configurations, it may be desirable to provide the surface of display 14 in active area AA with a bend. It may, for example, be desirable to bend display 14 along a bend axis such as bend axis 46 that runs through active area AA of display 14.

Figure 8:
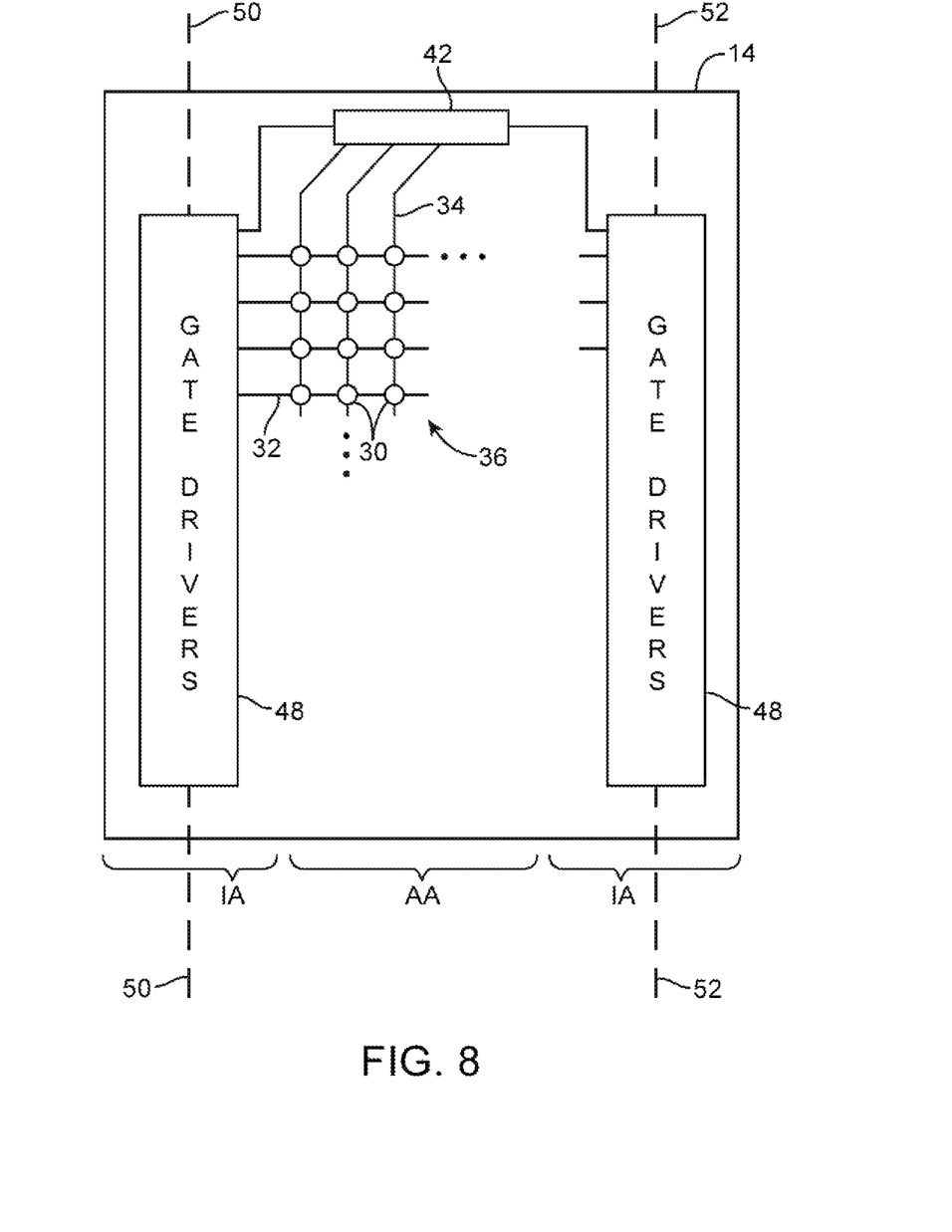
FIG. 8 is a top view of an illustrative display showing how the left side of the display may be bent along a bend axis that runs through gate driver circuitry in an inactive portion of the display and showing how the right side of the display may be bent along a bend axis that runs through gate driver circuitry in an inactive portion of the in accordance with an embodiment of the present invention.

As shown in the top view of illustrative display 14 of FIG. 8, display 14 may include support circuitry such as gate driver circuitry 48. Gate driver circuitry 48 may include latches and buffer circuits for supplying gate line control signals to gate lines 32. Thin-film transistors and metal traces for signal lines may be used in forming gate driver circuitry 48. In configurations for display 14 in which it is desired to minimize the size of the inactive left and right borders of the display, display 14 may be bent downwards along left-hand bend axis 50, which overlaps gate driver circuitry 48 on the left-hand side of display 14 and/or display 14 may be bent downwards along right-hand bend axis 52, which overlaps gate driver circuitry 48 on the right-hand side of display 14. Display 14 may also have other bent portions, if desired.

Whether bending display 14 along a bend axis such as bend axis 44 that overlaps inactive area IA in a display with a configuration of the type shown in FIG. 7, bending display 14 along a bend axis such as bend axis 46 that overlaps active area AA in a display with a configuration of the type shown in FIG. 7, or bending display 14 along a bend axis such as bend axis 50 or 52 that overlaps inactive left and right border regions IA in a display of the type shown in FIG. 8, it may be desirable to ensure that the display circuitry of display 14 is not damaged. Localized substrate thinning may be used to prevent damage.

Figure 9:
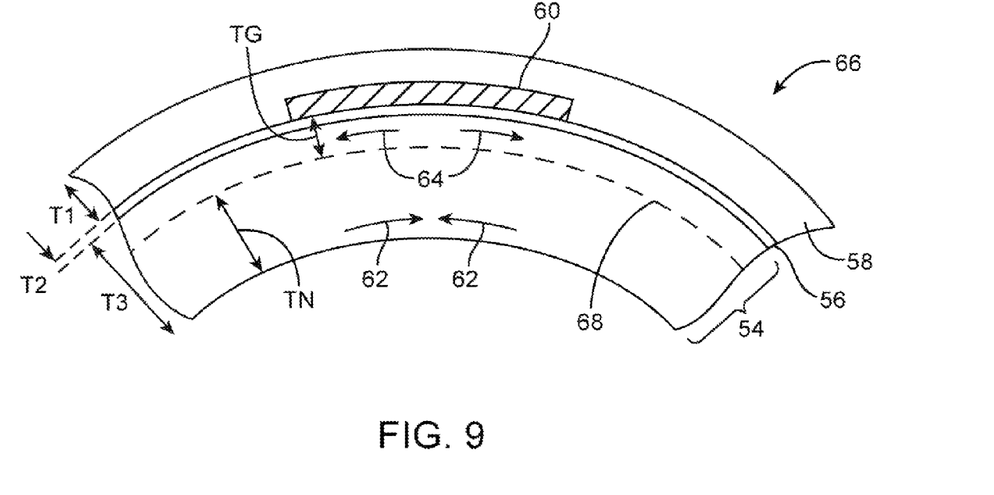
FIG. 9 is a cross-sectional side view of a portion of a bent display showing how stresses may be imposed on display circuitry in a flexible display in the absence of localized display substrate thinning in accordance with an embodiment of the present invention.

A cross-sectional side view of a bent flexible display that is not using localized substrate thinning is shown in FIG. 9. Display 66 of FIG. 9 has flexible polyimide substrate layer 54 with a thickness T3 (e.g., 10 microns). An insulating layer 56 of thickness T2 (e.g., layer of an inorganic material such as silicon nitride or silicon oxide or a polymer layer) may be formed on substrate layer 54. Display circuitry 60 such as metal traces for signal lines, thin-film transistors for gate driver circuitry and other support circuitry, thin-film transistors for display pixels, or other circuitry may be formed on the surface of layer 56. Polymer encapsulant layer 58 covers display circuitry 60 and substrate 54. The thicknesses T1 and T2 of encapsulant layer 58 and insulating layer 56 may be characterized by a total thickness of about 3000 angstroms (as an example).

When display 66 is bent as shown in FIG. 9, tensile stress is created in the upper portion of substrate 54, as indicated by arrows 64, whereas compressive stress is created in the lower portion of substrate 54, as indicated by arrows 62. It may be desirable to minimize the thickness of layers 56 and 58 to avoid creating an overly bulky configuration for display 66. However, the large thickness of substrate 54 relative to the flexible over-coating layer formed from layers such as layers 56 and 58 with this type of configuration causes the neutral stress plane for display 66 (i.e., the plane in which stress is a minimum because tensile stress 64 is balanced by compressive stress 62), to lie deep within layer 54. Neutral stress plane 68 may, for example, lie at a distance TN from the lower surface of layer 54. Because neutral stress plane 68 lies deep within layer 54, neutral stress plane 68 is located relatively far away from display circuitry 60 (i.e., a distance TG away).

As a result, display circuitry 60 of FIG. 9 is subjected to significant tensile stress 64. The tensile stress that is applied to display circuitry 60 in display 66 has the potential to render display 66 inoperable or to reduce the expected operating lifetime of display 66.

The stress that is induced in the display circuitry of FIG. 9 may be reduced by thinning the display substrate in appropriate portions of the display. The portions of the display that are not thinned are sufficiently thick to ensure that the display is robust and strong enough to be handled during assembly and use in device 10. The portions of the display that are locally thinned have a neutral plane that is vertically aligned with the thin-film transistors, metal lines, and other display circuitry, thereby preventing damage to the display circuitry from bend-induced stress.

Figure 10:
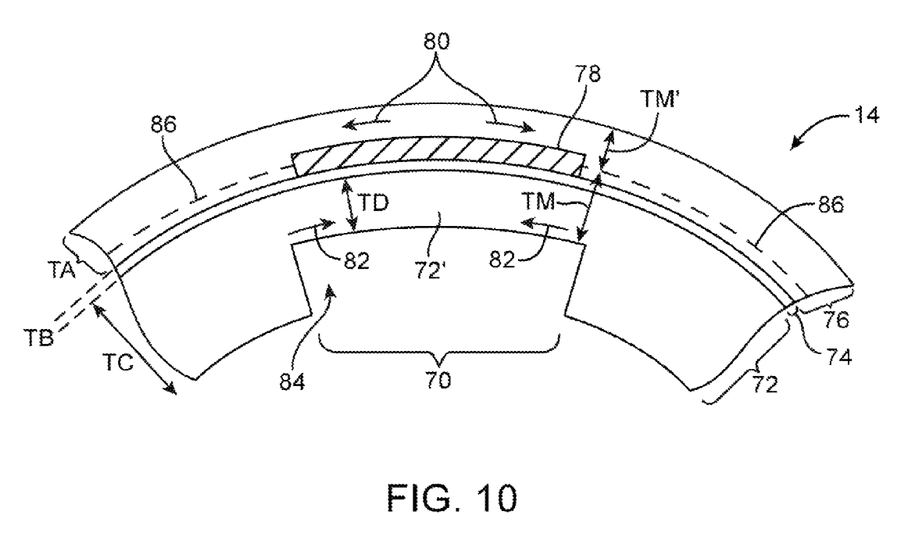
FIG. 10 is a cross-sectional side view of a portion of a display showing how stresses on display circuitry may be minimized by locally thinning a flexible display substrate layer under display circuitry that overlaps a bend in the display in accordance with an embodiment of the present invention.

An illustrative configuration for display 14 in which the display substrate has been thinned in this way is shown in the cross-sectional side view of FIG. 10. As shown in FIG. 10, display 14 of FIG. 10 has flexible substrate layer 72. Flexible substrate layer 72 may be formed from a sheet of flexible polymer such as a sheet of polyimide (as an example). The thickness TC of display substrate 72 may be about 10 microns, less than 10 microns, less than 5 microns, more than 10 microns, 1-20 microns, 5-30 microns, or other suitable thickness.

An optional insulating layer 74 of thickness TB (e.g., layer of an inorganic material such as silicon nitride or silicon oxide or a polymer layer) may be formed on substrate layer 74. Display circuitry 78 such as metal traces for signal lines, thin-film transistors for gate driver circuitry such as gate driver circuitry 48 of FIG. 8, thin-film transistors for display support circuitry 42, thin-film transistors for display pixels 30 of display pixel array 36, thin-film transistors for other display circuitry, and other display circuitry 78 may be formed on the surface of layer 74.

Polymer encapsulant layer 76 covers display circuitry 78 and substrate 72 (including substrate coating layer 74). Thicknesses TA and TB of encapsulant layer 76 and insulating layer 74, respectively, may have a total thickness of 3000 angstroms, less than 3000 angstroms, 1000 to 5000 angstroms, more than 3000 angstroms, or other thickness. To minimize the thickness of display 14, thicknesses TA and TB are generally less than thickness TC of substrate TC.

When bent as shown in FIG. 10, tensile stress is created in display 14, as indicated by arrows 80, and compressive stress is created in display 14, as indicated by arrows 82. In locally thinned region 70, recess 84 is created in substrate layer 72, so that substrate layer 72 has a thickness TD in thinned region 70 that is thinner than substrate thickness TC elsewhere in substrate 72. Due to the relative thinness of thinned portion 72' of substrate 72 in region 70, compressive stress 82 in the layers of display 14 is formed relatively close to display circuitry 78 and tensile stress 80 is formed in encapsulant layer 76, rather than in substrate 72. As a result, neutral stress plane 86 is vertically aligned with display circuitry 78 (i.e., neutral stress plane passes through display circuitry 78 or near to display circuitry 78). This minimizes bending-induced stress in display circuitry 78 and avoids creating premature failures in circuitry 78 due to bending of flexible display 14.

In configurations in which layers 72, 74, and 76 are formed from the same or similar materials, neutral plane 86 will tend to be located midway between the outer surface of layer 76 and the inner surface of portion 72' of layer 72 (i.e., distances TM and TM' of FIG. 10 will be equal). If desired, different types of materials may be used in forming substrate 72 and other layers in display 14 (e.g., materials with different Young's modulus values). When different types of materials are used in the layers of display 14, the sizes of TM' and TM may differ while ensuring that neutral plane 86 is aligned with display circuitry 78. In particular, TM' may be smaller than TM (e.g., when relatively more tensile stress is produced in layer 76 than compressive stress is produced in layer 72 for a given thickness) or TM' may be larger than TM (e.g., when relatively less tensile stress is produced in layer 76 than compressive stress is produced in layer 72 for a given thickness). The relative thicknesses and materials used for the upper and lower layers of display 14 and the depth of recess 84 in locally thinned region 70 are preferably selected so that neutral plane 86 will coincide with display circuitry 78, thereby minimizing damage to display circuitry 78 when display 14 is bent.

Figure 11:
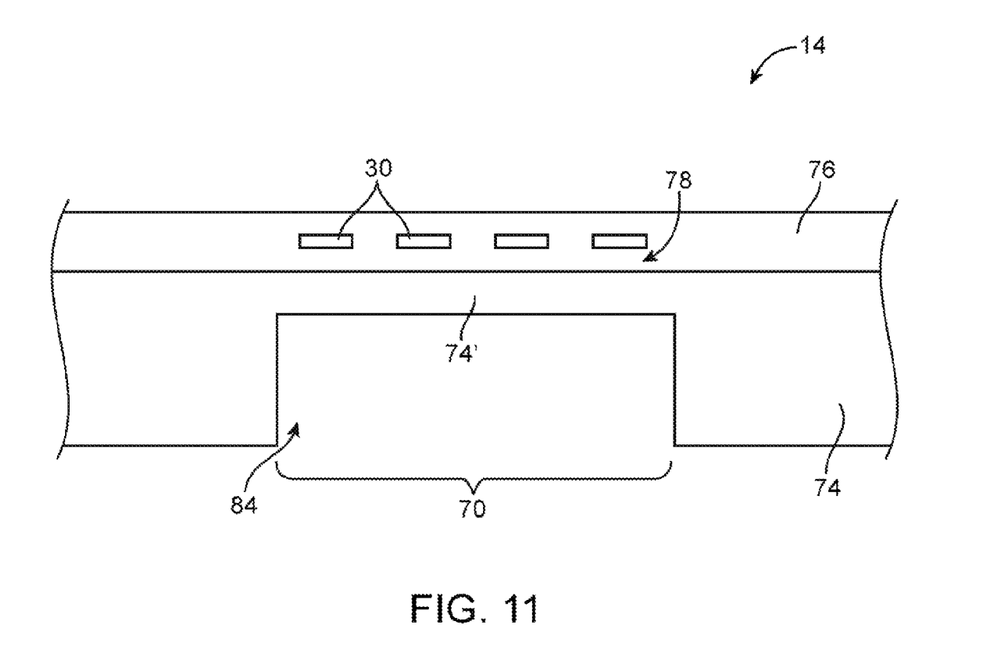
FIG. 11 is a cross-sectional side view of a display with multiple display pixels or other display circuits that overlap a locally thinned substrate region in accordance with an embodiment of the present invention.

As shown in FIG. 11, multiple display pixels 30 or other display circuits may overlap a single recess 84 (i.e., thinned region 70 may span multiple rows or columns of display pixels 30 in display pixel array 36). In configurations in which thinned region 70 is formed under signal lines or display support circuitry in inactive area IA, each thinned region 70 may overlap one or more signal lines and/or one or more gate driver circuits or other display support circuits. To facilitate bending of display 14 along the edges of display 14, thinned region 70 may span the entire width (or entire height) of display 14 (e.g., region 70 may extend into the page across all of display 14 in the orientation of FIG. 11).

Figure 12:
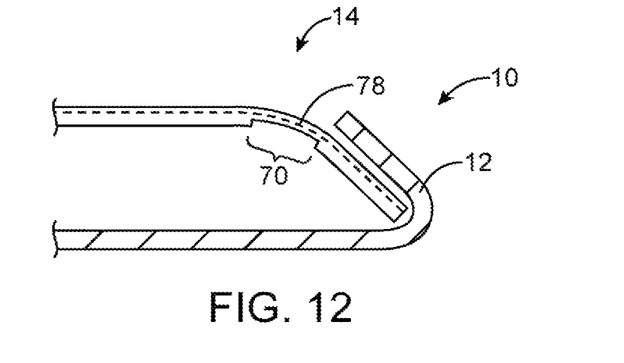
FIG. 12 is a cross-sectional side view of a portion of an illustrative flexible display that has been bent at an angle of less than 90° in accordance with an embodiment of the present invention.

FIG. 12 is a cross-sectional side view of display 14 in a configuration in which display 14 has been bent downwards from a horizontal plane that encompasses the surface of display 14 by an angle of less than 90°. Locally thinned region 70 may extend along the bent edge of display (e.g., into the page of FIG. 12) to prevent damage to overlapping display circuitry 78. Housing 12 covers the bent edge of display 14 in the FIG. 12 configuration. This is merely illustrative. The bent edges of display 14 may be visible, may be covered by housing portions, or may be mounted in device 10 using other techniques.

Figure 13:
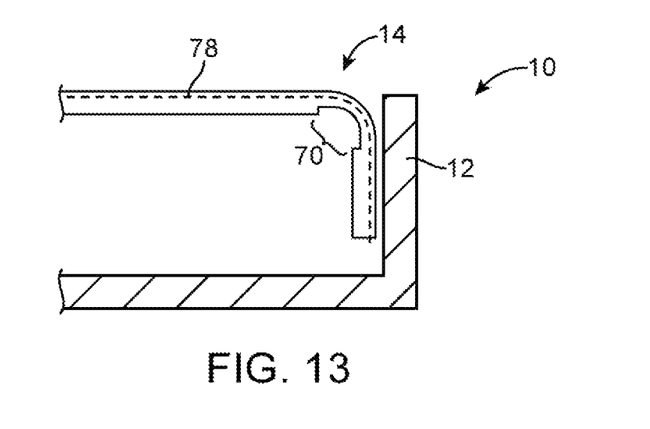
FIG. 13 is a cross-sectional side view of a portion of an illustrative flexible display that has been bent at a right angle in accordance with an embodiment of the present invention.

In the FIG. 13 example, the edge of display 14 has been bent at a right angle, allowing display 14 to be mounted within housing 12 of device 10. Locally thinned region 70 may run along the edge of display 14 parallel with the bend axis of the right angle bend (i.e., region 70 may extend into the page in the orientation of FIG. 13).

Figure 14:
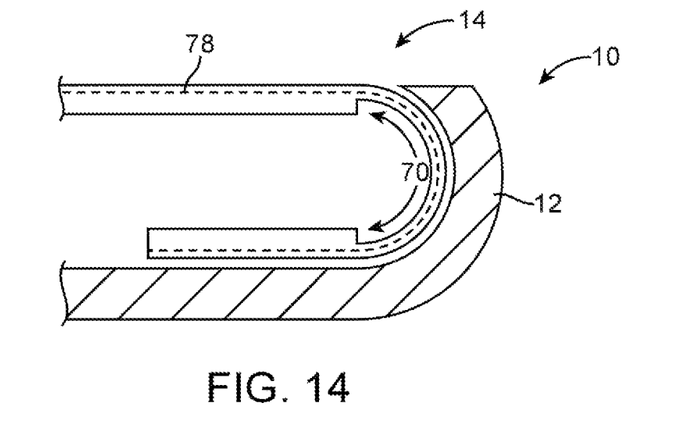
FIG. 14 is a cross-sectional side view of a portion of an illustrative flexible display that has been bent sufficiently to fold back on itself in accordance with an embodiment of the present invention.

In the FIG. 14 example, display 14 has an edge that has been folded back on itself. Locally thinned region 70 may run along the edge of display 14 and housing 12 (into the page in the orientation of FIG. 14). By locally thinning display 14 along its bent edge, damage to display circuitry 78 due to bending stresses at the edge of display 14 may be minimized.

Other configurations for mounting a display with bent portions into housing 12 of device 10 may be used if desired. The illustrative schemes of FIGS. 12, 13, and 14 are merely illustrative.

Figure 15:
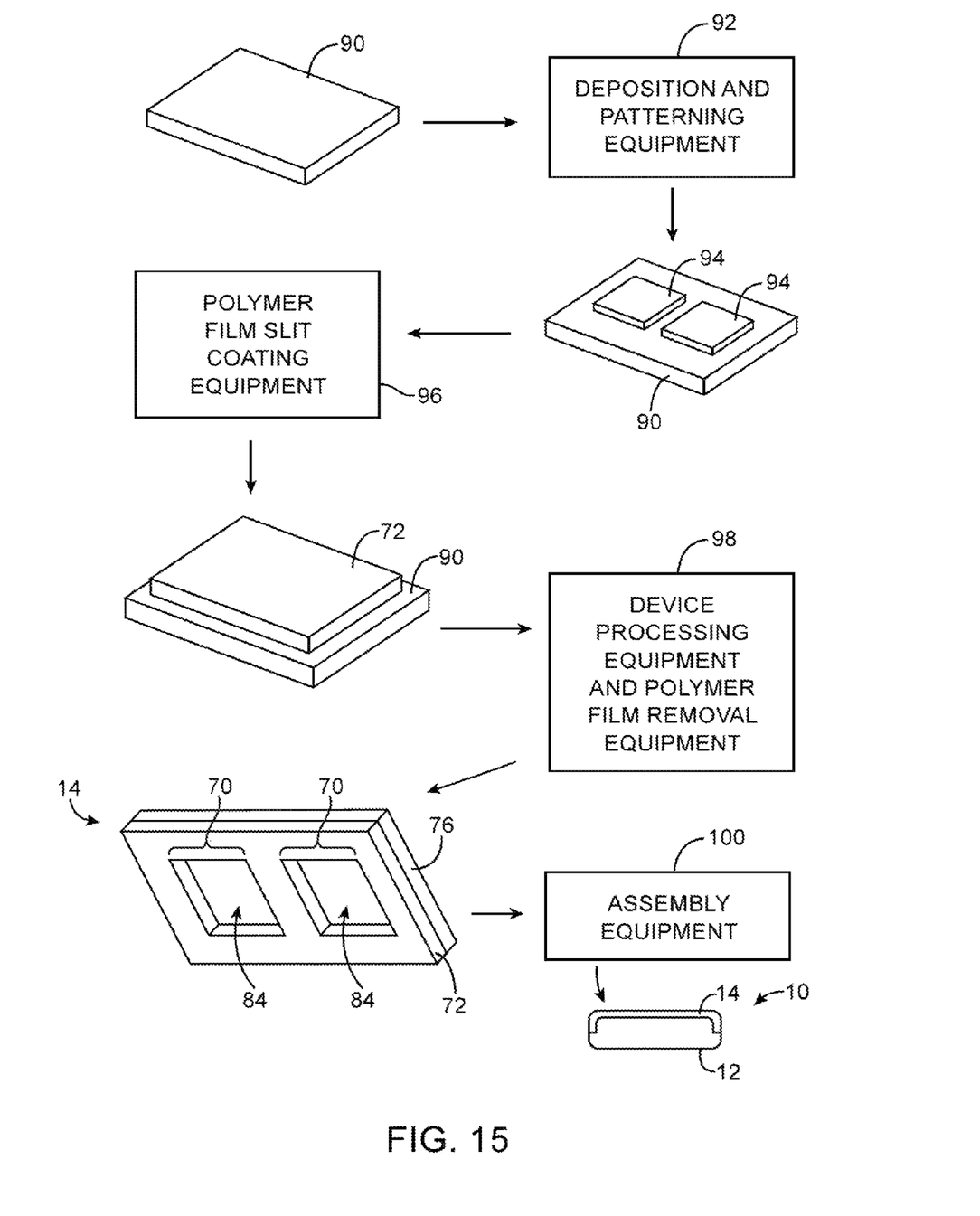
FIG. 15 is a diagram of equipment and fabrication operations involved in forming an electronic device with a flexible display in accordance with an embodiment of the present invention.

FIG. 15 is a diagram of fabrication steps and equipment of the type that may be used in forming a device having a flexible display with bent portions in accordance with an embodiment of the present invention.

As shown in FIG. 15, deposition and patterning equipment 92 may be used to form raised structures 94 on the surface of support structure 90. Support structure 90 may be a sheet of glass, a layer of a plastic or ceramic, or other planar support member. Raised structures 94 may be thin-film structures formed from a material such as silicon nitride, other inorganic materials, or other materials. Deposition and patterning equipment 92 may include physical vapor deposition equipment and other equipment for depositing a blanket layer of silicon nitride or other thin film on the surface of support member 90. Deposition and patterning equipment 92 may also include photolithographic patterning equipment (e.g., equipment for depositing and patterning photoresist, equipment for dry or wet etching of the deposited blanket thin film that has been deposited on planar support member 90, etc.). In general, raised areas 94 of support member 90 may be formed using screen printing, pad printing, ink-jet printing, shadow mask deposition, electrochemical deposition, chemical vapor deposition, or other techniques. The use of photolithography to pattern a blanket thin film inorganic layer on the top surface of support member 90 is merely illustrative.

The shapes in which raised areas 94 are formed on support member 90 correspond to the desired locally thinned regions in display 14. For example, if it is desired to form locally thinned display substrate regions in strips along the left and right edges of display 14, raised regions 94 may have the shape of elongated strips that run parallel to the left and right edges of display 14.

Planar support member 90 and the raised structures formed from patterned thin-film layer 94 serve as a polymer shaping structure for forming locally thinned regions 70 in deposited polymer material. As shown in FIG. 15, after thin-film layer 94 has been patterned onto the surface of support structures 90 to form raised areas, polymer deposition equipment such as polymer film slit coating equipment 96 or other equipment for applying liquid polymer to the surface of structures 94 and 90 may be used to deposited polymer substrate layer 72 as a coating on the surface of support structure 90. Equipment 96 may, for example, include a liquid polymer slit dispenser that deposits a thin layer of liquid polymer over the surface of support member 90 and associated raised portions 94. Equipment 96 may also include light sources such as an ultraviolet light source, heat sources, or other equipment for curing the deposited polymer of substrate layer 72. If desired, the display substrate layer 72 may be formed from a material that cures at room temperature (e.g., a two-part adhesive, etc.). The use of a thermally cured polymer or ultraviolet-light-cured polymer in forming polymer display substrate layer 72 is merely illustrative.

After forming display substrate layer on support structures 90 and raised areas 94 of support structure 90, device processing equipment and polymer film removal equipment 98 may be used in removing polymer substrate 72 from support structures 90 and raised areas 94. Equipment 98 may include thin-film processing equipment for forming thin-film transistors, equipment for depositing and patterning metal to form metal traces for signal lines, and other fabrication equipment for forming transistors, conductive lines, and other display circuitry. The display circuitry that is formed may include display pixels 30 in display pixel array 36, gate driver circuitry 48 (FIG. 8), display driver circuitry and other support circuitry 42 (FIGS. 7 and 8), and other display circuitry 78. Equipment 98 may also include deposition equipment for forming layers such as insulating layer 74 and encapsulation layer 76 of FIG. 10.

After substrate 72 and associated structures such as display circuitry 78 and encapsulation layer 76 have been formed, these layers may be peeled off of support structure 90 and raised areas 94 on support structure 90. The portions of substrate layer 72 that were formed on top of raised portions 94 will be recessed (i.e., these portions will form recesses 84 for locally thinned regions 70), as shown in FIG. 15. If, for example, raised portions 94 have the shape of elongated vertical strips of material running along the left and right sides of display 14, the resulting recessed portions 84 and locally thinned regions 70 of display 14 will have corresponding elongated strip shapes.

Following formation of flexible display 14 with locally thinned regions 70 using equipment 98, assembly equipment 100 may be used to bend display 14 and mount display 14 within housing 12 and device 10. Assembly equipment 100 may, for example, bend display 14 along one or more of its edges and/or may create a curved surface for display pixel array 36 in display 14 by bending display 14 in its active area AA. Bent edges or other bends in display 14 may be associated with right angle bends in substrate 72 and/or bends at shallower or deeper angles.

The foregoing is merely illustrative of the principles of this invention and various modifications can be made by those skilled in the art without departing from the scope and spirit of the invention.

What is claimed is:

1. A display, comprising:
 a display substrate having an active area, an inactive area, and a locally thinned region, wherein the locally thinned region is located in the inactive area;
 an array of display pixels on the display substrate in the active area;
 display circuitry including gate driver circuitry on the display substrate in the inactive area, wherein the gate driver circuitry overlaps the locally thinned region of the display substrate, wherein the display pixels lie in a plane, and wherein the locally thinned region of the display substrate curves out of the plane such that the inactive area is at least partially hidden from view by a user; and
 an encapsulation layer formed over the gate driver circuitry such that a neutral stress plane intersects with and spans laterally across the entire width of the gate driver circuitry over the locally thinned region of the display substrate.

2. The display defined in claim 1 wherein the inactive area does not contain display pixels.

3. The display defined in claim 2 wherein the display circuitry includes a plurality of metal lines in the inactive area, wherein the metal lines overlap the locally thinned region, and wherein the metal lines curve with the locally thinned region.

4. The display defined in claim 3 wherein the metal lines include serpentine segments that curve with the locally thinned region of the display substrate.

5. The display defined in claim 1 wherein the display pixels comprise organic light-emitting diode display pixels.

6. The display defined in claim 1 wherein the display circuitry includes thin-film transistors.

7. The display defined in claim 1 wherein the display substrate comprises a polymer layer.

8. The display defined in claim 7 wherein the encapsulation layer comprises a polymer encapsulation layer on the display substrate.

9. The display defined in claim 8 wherein at least a portion of the neutral stress plane lies within the polymer encapsulation layer.

10. A method of forming a display, comprising:
 depositing a polymer display substrate layer onto a support structure having raised areas so that the raised areas create recesses within the polymer display substrate layer and create corresponding locally thinned regions of the polymer display substrate layer that are thinned relative to an adjacent region of the polymer display substrate layer, wherein the polymer display substrate layer has a first thickness in the locally thinned regions and a second thickness in the adjacent region and wherein the first thickness is less than the second thickness;
 forming an insulating layer above the polymer display substrate layer;
 forming display circuitry including at least one thin-film transistor on the polymer display substrate layer that at least partly overlaps the locally thinned regions; and
 forming an encapsulant layer over the display circuitry such that a neutral stress plane runs through the thin-film transistor where the thin-film transistor overlaps one of the locally thinned regions, wherein a thickness of the encapsulant layer and the insulating layer is less than the second thickness of the polymer display substrate layer in the adjacent region.

11. The method defined in claim 10 further comprising:
 removing the deposited polymer display substrate layer and the display circuitry from the support structure.

12. The method defined in claim 11 further comprising:
 bending the polymer display substrate layer and display circuitry that have been removed from the support structure along the locally thinned regions.

13. The method defined in claim 12 wherein forming the display circuitry comprises forming an array of display pixels in an active area on the display, wherein the active area is surrounded by an inactive border area, wherein the locally thinned regions are in the inactive border area, and wherein bending the polymer display substrate layer comprises bending the polymer display substrate layer in the inactive border area.

14. An electronic device, comprising:
 a housing having an interior surface; and
 a flexible display mounted in the housing, wherein the flexible display has at least one edge that is bent along a bend axis and wherein the flexible display includes a polymer substrate with a first and second regions separated by a locally thinned region that overlaps the bend axis, wherein the flexible display includes a metal trace formed on the polymer substrate and an encapsulant layer formed on the metal trace such that a neutral stress plane intersects with the metal trace where the metal trace overlaps the locally thinned region and such that tensile stress is formed in the encapsulant layer where the encapsulant layer overlaps the metal trace, wherein the first region of the polymer substrate defines a plane, wherein the second region of the polymer substrate is bent out of the plane, and wherein the second region of the polymer substrate is parallel to the interior surface of the housing.

15. The electronic device defined in claim 14 wherein the flexible display includes an array of organic light-emitting diode display pixels in an active area, wherein the metal trace is one of a plurality of metal traces in an inactive area that surrounds the active area, and wherein the metal traces include at least some bent metal traces in the portion of the flexible display that overlaps the locally thinned region.

* * * * *